(12) United States Patent
Kyran et al.

(10) Patent No.: US 12,091,508 B2
(45) Date of Patent: Sep. 17, 2024

(54) POLYIMIDES FOR TEMPORARY BONDING ADHESIVES, METHODS FOR MANUFACTURING OF THERMOPLASTIC POLYIMIDE MATERIALS, AND METHODS FOR THIN WAFER BONDING USING THE SAME

(71) Applicant: Kaneka Americas Holding, Inc., Pasadena, TX (US)

(72) Inventors: Samuel Kyran, Pasadena, TX (US); Hiroyuki Furutani, Pasadena, TX (US)

(73) Assignee: Kaneka Americas Holding, Inc., Pasadena, TX (US)

( * ) Notice: Subject to any disclaimer, the term of this patent is extended or adjusted under 35 U.S.C. 154(b) by 1024 days.

(21) Appl. No.: 16/977,714

(22) PCT Filed: Mar. 4, 2019

(86) PCT No.: PCT/US2019/020571
§ 371 (c)(1),
(2) Date: Sep. 2, 2020

(87) PCT Pub. No.: WO2019/169394
PCT Pub. Date: Sep. 6, 2019

(65) Prior Publication Data
US 2021/0054147 A1    Feb. 25, 2021

Related U.S. Application Data

(60) Provisional application No. 62/637,720, filed on Mar. 2, 2018.

(51) Int. Cl.
*C09J 179/08* (2006.01)
*C08G 73/10* (2006.01)
*H01L 21/68* (2006.01)

(52) U.S. Cl.
CPC ..... *C08G 73/1064* (2013.01); *C08G 73/1042* (2013.01); *C08G 73/1071* (2013.01); *C09J 179/08* (2013.01); *C09J 2400/143* (2013.01); *H01L 21/68* (2013.01)

(58) Field of Classification Search
None
See application file for complete search history.

(56) References Cited

U.S. PATENT DOCUMENTS

| 6,693,162 | B2 | 2/2004 | Tsuji et al. |
| 2015/0228527 | A1 | 8/2015 | Watanabe et al. |
| 2015/0318227 | A1 | 11/2015 | Shimada et al. |

FOREIGN PATENT DOCUMENTS

| JP | H06256733 A | 9/1994 |
| JP | 107258622 A | 10/1995 |
| JP | H07258611 A | 10/1995 |
| JP | 2002012845 | * 1/2002 |
| JP | 2003306649 | * 10/2003 |
| JP | 3482946 B2 | 1/2004 |
| JP | 20060125604 A | 5/2006 |
| JP | 2007297480 | * 11/2007 |
| JP | 2007297480 A | 11/2007 |
| JP | 2007297512 A | 11/2007 |
| JP | 2010001428 | * 1/2010 |
| JP | 2010001428 A | 1/2010 |
| JP | 2011137149 A | 7/2011 |
| JP | 2012082329 A | 4/2012 |
| JP | 2012167186 A | 9/2012 |
| JP | 2014214213 A | 11/2014 |
| WO | 03027178 A2 | 4/2003 |
| WO | 2003076515 A1 | 9/2003 |
| WO | 2009003029 A2 | 12/2008 |

OTHER PUBLICATIONS

K. Zoschke et al, "Polyimide based Temporary Wafer Bonding Technology for High Temperature Compliant TSV Backside Processing and Thin Device Handling," Electronic Components and Technology Conference (ECTC), IEEE 62nd, Jul. 2012 (8 pages).

T. Itabashi et al., "High temperature Bonding Solutions Enabling Thin Wafer Process and Handling on 3D-IC Manufacturing," IEEE 3DIC 2011, Jan. 2012 (4 pages).

I. Bacosca et al., "Structure-property correlation of bromine substitution in polyimides," J Polym Res, vol. 20, No. 53, 2013 (14 pages).

Z. Shi et al., "Thermo-processable polyimides with high thermo-oxidative stability as derived from oxydiphtalic anhydride and bisphenol A type dianhydride," High Perform. Polym., vol. 12, pp. 377-393, Jun. 2000 (17 pages).

H. Furutani et al.,"Synthesis and properties of polyester imides based on 2,2-bis(4-hydroxyphenyl) propanedibenzoate-3,3' ,4,4' -tetracarboxylic acid dianhydride," Konbunshi Ronbunshu, vol. 70, No. 11, pp. 647-654, 2013 (12 pages).

(Continued)

*Primary Examiner* — David J Buttner
(74) *Attorney, Agent, or Firm* — Osha Bergman Watanabe & Burton LLP

(57) ABSTRACT

Methods may include coating a substrate with a polyimide precursor composition prepared from a reaction of a diamine component and a dianhydride component, wherein the reaction includes: a diamine component containing one or more diamines having the formula: wherein R3 is selected from hydrogen, methyl, and halogen; a dianhydride component containing one or more dianhydrides, wherein the one or more dianhydrides include 4,4'-bisphenol A dianhydride (BPADA); and at least one comonomer selected from: one or more additional diamine comonomers, wherein the one or more additional diamine comonomers are present at 1 to 40 mol % of the diamine component; and/or one or more additional dianhydride comonomers, wherein the one or more additional dianhydride comonomers are present at 1 to 40 mol % of the dianhydride component; and curing the polyimide precursor composition to generate a polyimide adhesive on the substrate.

18 Claims, 1 Drawing Sheet

(56) References Cited

OTHER PUBLICATIONS

International Search Report issued in corresponding International Application No. PCT/US2019/020571; mailed Jun. 25, 2019 (6 pages).
Written Opinion of the International Searching Authority issued in corresponding International Application No. PCT/US2019/020571; dated Jun. 25, 2019 (10 pages).

* cited by examiner

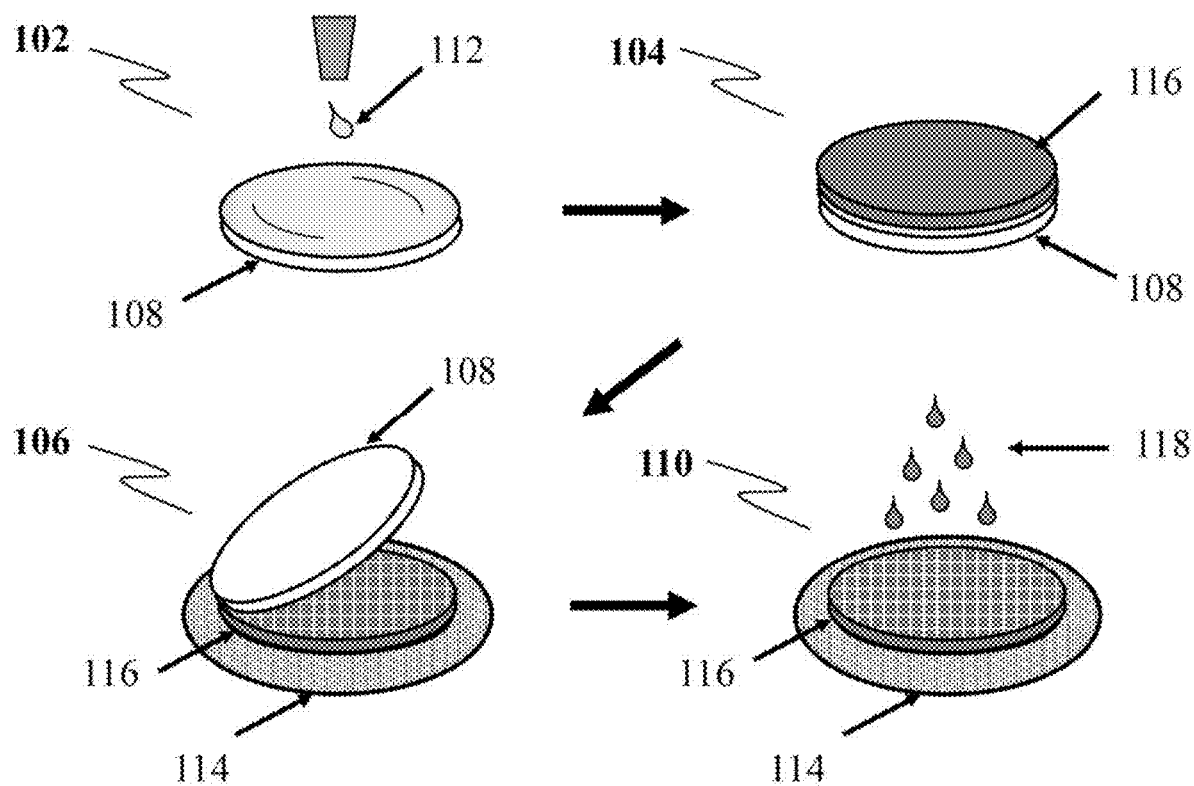

POLYIMIDES FOR TEMPORARY BONDING ADHESIVES, METHODS FOR MANUFACTURING OF THERMOPLASTIC POLYIMIDE MATERIALS, AND METHODS FOR THIN WAFER BONDING USING THE SAME

BACKGROUND

In semi-conductor manufacturing, temporary bonding adhesives (TBA) are used for handling extremely thin wafers during processes such as high dielectric deposition and through silicon via (TSV) architectures that are often employed in producing next-generation integrated circuit chips. While thin wafer semiconductors possess improved heat dissipation, three-dimensional stacking, reduced electrical resistance, and substrate flexibility, the reduction in wafer thickness combined with an increasing wafer diameter produces the tendency for the wafer to warp and fold and require support during the backside grinding process and through the subsequent processes such as lithography, deposition, and the like. Using temporary adhesives to bond the processed device wafer to a rigid carrier wafer offers an efficient solution, and is becoming increasingly important in both integrated circuit and MEMS applications, mainly due to its low cost, ease of processing, and adaptability.

SUMMARY

This summary is provided to introduce a selection of concepts that are described further below in the detailed description. This summary is not intended to identify key or essential features of the claimed subject matter, nor is it intended to be used as an aid in limiting the scope of the claimed subject matter.

In one aspect, embodiments of the present disclosure are directed to methods that include coating a substrate with a polyimide precursor composition prepared from a reaction of a diamine component and a dianhydride component, wherein the reaction includes: a diamine component containing one or more diamines having the formula:

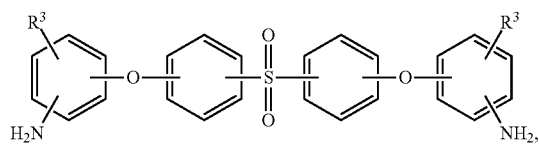

wherein R3 is selected from hydrogen, methyl, and halogen; a dianhydride component containing one or more dianhydrides, wherein the one or more dianhydrides include 4,4'-bisphenol A dianhydride (BPADA); and at least one comonomer selected from: one or more additional diamine comonomers, wherein the one or more additional diamine comonomers are present at 1 to 40 mol % of the diamine component; and/or one or more additional dianhydride comonomers, wherein the one or more additional dianhydride comonomers are present at 1 to 40 mol % of the dianhydride component; and curing the polyimide precursor composition to generate a polyimide adhesive on the substrate.

In another aspect, embodiments of the present disclosure are directed to coated substrates including: a substrate coated with a polyimide adhesive, wherein the polyimide adhesive is prepared from a reaction of a diamine component and a dianhydride component, wherein the reaction includes: a diamine component including diamine bis[(aminophenoxy)phenyl]sulfone (BAPS); a dianhydride component including 4,4'-bisphenol A dianhydride (BPADA); and at least one comonomer selected from: one or more additional diamine comonomers, wherein the one or more additional diamine comonomers contain 1 to 40 mol % of the diamine component; and/or one or more additional dianhydride comonomers, wherein the one or more additional dianhydride comonomers contain 1 to 40 mol % of the dianhydride component.

In another aspect, embodiments of the present disclosure may be directed to methods that include: coating a substrate with a polyimide precursor composition prepared from a reaction mixture containing a diamine component and a dianhydride component; wherein the reaction mixture includes: a diamine component including one or more diamines having the formulae:

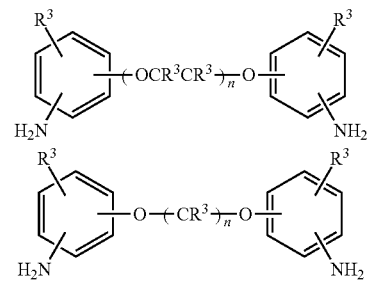

wherein each R3 is independently selected from hydrogen, methyl, and halogen, and n is an integer ranging from 1 to 7, wherein the one or more diamines are present at 1 to 60 mol % of the reaction mixture; and a dianhydride component; and at least one additional comonomer selected from one or more additional diamine comonomers and/or one or more additional dianhydride comonomers, wherein the dianhydride component and the at least one additional comonomer are present at 40 to 99 mol % of the reaction mixture; and curing the polyimide precursor composition to generate a polyimide adhesive on the substrate.

In another aspect, embodiments of the present disclosure may be directed to compositions that include: a polyimide precursor composition prepared from a reaction of a diamine component and a dianhydride component, wherein the reaction includes: a diamine component containing one or more diamines having the formula:

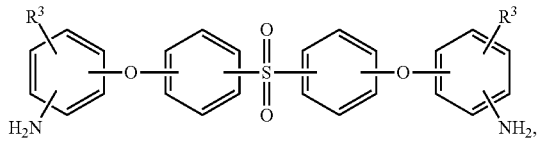

wherein R3 is selected hydrogen, methyl, and halogen; a dianhydride component containing one or more dianhydrides, wherein the one or more dianhydrides include 4,4'-bisphenol A dianhydride (BPADA); and one or more selected comonomers selected from: one or more additional diamine comonomers, wherein the one or more additional diamine comonomers are present at 1 to 40 mol % of the diamine component; and/or one or more additional dianhydride comonomers, wherein the one or more additional dianhydride comonomers are present at 1 to 40 mol % of the dianhydride component; wherein the composition is substantially free of thermosetting compounds.

Other aspects and advantages of the disclosure will be apparent from the following description and the appended claims.

BRIEF DESCRIPTION OF FIGURES

FIG. 1 is a schematic illustration showing a semi-conductor manufacturing process in accordance with embodiments of the present disclosure.

DETAILED DESCRIPTION

Embodiments of the present disclosure are directed to thermoplastic polyimide adhesives used for a number of industrial applications, including adhesive laminated insulating films for wire and cable wrappings, print circuit board manufacturing, and thin wafer processing. Polyimide adhesives in accordance with the present disclosure may exhibit one or more features that include i) select solvent solubility for coating and removability, ii) thermal resistance under extended periods, iii) adherence to solid substrates such as plastic, glass or silicon, and iv) low residual stress on the substrate to minimize warpage. In one or more embodiments, polyimide compositions may be formulated in a polar solvent to aid application to surfaces and control film thickness.

In semiconductor manufacturing, temporary bonding adhesives used commercially have included acrylic, rubber and silicone materials that only go up to 250° C., which may be unsatisfactory for modern techniques. Suitable adhesives should also be soluble in standard polar solvents used in adhesive application and removal. In addition, polymer adhesives should exert minimal residual stress on the substrates, by way of having low modulus or low coefficient of thermal expansion (CTE), to prevent warpage of thin wafers prior to and during adhesion to rigid substrates such as glass, silicon or metals. In one or more embodiments, thermoplastic polyimide adhesive compositions may be formulated to be substantially free of thermosetting components, including polymers and other additives. As used herein, substantially free is defined to be less than 10 wt %. In more particular embodiments, the thermoplastic polyimide adhesive compositions may be formulated to have less than 5 wt %, 2 wt %, or 1 wt % thermosetting components or even be free of thermosetting components. For example, in temporary adhesive applications, thermosetting compounds that crosslink under increased temperatures, may be excluded from adhesive compositions to avoid drastic changes in adhesive properties that could impede removal of a substrate from an adhesive film or increase residue deposition.

With particular respect to FIG. 1, a generalized process for silicon wafer bonding and debonding is shown. Beginning at 102, an adhesive polyimide composition or precursor 112 is applied to a carrier substrate 108 such as by spin coating as shown, which may be followed by heating to cure the polyimide 112 prior to affixing the wafer to substrate 108. At 104, the silicon wafer 116 is then attached to the adhesive-coated substrate 108. The temporary adhesive 112 planarizes the topography of the device wafer 116 and establishes a void free bond interface between the substrate 108 and device wafer 116. The wafer 116 may then be processed as normal (which may include, for example, grinding, etching, deposition, etc.) without warping or breakage due to the reinforcing properties of the attached substrate 108. After processing, the substrate 108 is removed at 106 by a number of known mechanical and/or chemical techniques including disrupting the adhesive by solvent through perforated carrier wafers, laser de-bonding, and the like. During removal of the substrate 108, a vacuum chuck 114 or similar device is used to secure the silicon wafer 116, which is then cleaned and processed to remove adhesive residues at 110. Adhesive residues may be removed using various organic solvents 118, for example, while wafer 116 is mounted to chuck 114.

Polyimide compositions in accordance with the present disclosure may have high thermal resistance when used in high temperature applications (350° C. or more), in addition to exhibiting good adhesiveness for convenient handling of thin wafers and similar temporary adhesive applications. In one or more embodiments, polyimides may incorporate monomers with sulfone and ether linkages to enhance the solubility of the resulting polymer in polar solvents, up to 40% by weight (wt %) solid content in some cases. In one or more embodiments, polyimides may also incorporate specific soft monomers containing alkyl chains to reduce the residual stress acted on thin wafers by as much as 30%.

Polyimide compositions in accordance with the present disclosure may exhibit a number of properties that are well suited for high temperature applications and use as temporary industrial adhesives. For example, the weight loss of polyimide films in accordance with the present disclosure may exhibit a weight loss of less than 2 wt % after exposure to 350° C. for 60 minutes in some embodiments, less than 1 wt % in other embodiments, and less than 0.5 wt % in yet other embodiments.

Polyimide compositions may exhibit glass transition temperatures (Tg) in the range having a lower limit selected from any of 100, 150, or 200° C., to an upper limit selected from any of 200, 230, and 300° C., where any lower limit may be paired with any upper limit.

Moreover, polyimide compositions may have a temperature for 5% weight loss ($Td_{5\%}$) in the range of 400 to 500° C.

Polyimide Synthesis

Polyimide compositions in accordance with the present disclosure are prepared from a reaction of a diamine and dianhydride, under standard polymerization conditions, including reaction in a polar solvent such as gamma-butyrolactone or dimethylformamide. For example, polyimide polymerization may be performed under inert atmosphere, such as argon or nitrogen gas by dissolving or diffusing at least one kind of diamine component and a dianhydride in a polar solvent to obtain a solution of a polyamic acid polymer. During the reaction process between diamine and dianhydride, the reaction first produces a polyamic acid intermediate compound, which may then undergo ring closure to expel water and generate the corresponding polyimide, as shown in reaction scheme I. In scheme I, $R^1$ and $R^2$ are hydrocarbon radicals that are described in greater detail in the sections describing the dianhydrides and diamines respectively.

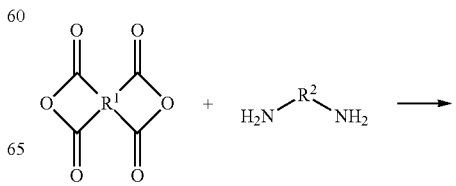

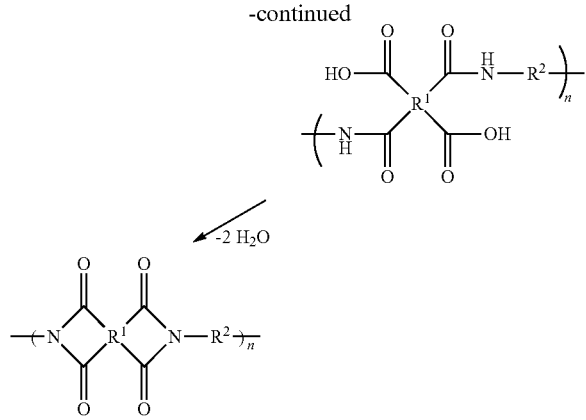

In one or more embodiments, polyimide composition may be prepared from a polyimide precursor composition containing the corresponding polyamic acid, which is cured to form the polyimide composition. In some embodiments, polyimide precursor compositions may be formulated as a varnish that is coated on a substrate and heated to remove the polar solvent and to form the corresponding polyimide.

In one or more embodiments, polyimide compositions may be formulated as a solubilized polymer in a polar solvent that may be used in coating applications for solid substrates including glass, plastic, and silicon wafers. The final product can be in the form of a solution, film or powder.

Polyimide compositions and polyimide precursor compositions in accordance with the present disclosure may be applied to any number of appropriate substrates for adhesive applications. Substrates may include glass, silicon, silicon carbide, and metals such as aluminum and copper, plastics such as polyethylene terephthalate, and the like. Compositions in accordance with the present disclosure may be applied to a substrate using a number of coating methods known in the art such as a bar coater, a roll coater, a knife coater, a comma coater, a reverse coater, a doctor-blade float coater, a gravure coater, a slit-die coater, a spin coater, screen printing, and the like. In one or more embodiments, polyimide compositions may be used to generate films on a selected substrate that may range from a lower limit selected from any of 0.1, 0.5, and 1 µm, to an upper limit selected from 20, 100, and 200 µm, where any lower limit may be combined with any upper limit.

However, it is envisioned that the thickness of the film may be varied depending on the requirements for the given application.

Polar solvent may be evaporated following coating on a substrate using thermal processing under temperatures that range from of 160° C. to 250° C. for a time period that may range from about 5 to 90 minutes. In one or more embodiments, temperatures may be increased incrementally and held at intermediate temperatures for a time period of 5 to 90 minutes to avoid issues such as bubbling and vigorous solvent evolution. However, temperatures may be higher or lower than the above recited ranges depending on the quality of adhesive required and the solvent tolerance for the particular application. For polyimide precursor compositions containing polyamic acids the elevated temperatures may also initiate dehydration reactions that convert the precursor to the final polyimide. In one or more embodiments, substrates coated with polyimide precursor compositions containing polyamic acid may be heat treated at temperatures in the range of 80 to 400° C. for a time period sufficient to convert the polyamic acid to polyimide.

Polyimides in accordance with the present disclosure may also exhibit solubility in various polar solvents following curing to enhance release of the adhesive and underlying substrate from the processed wafer, and to remove any remaining adhesive residues. For example, following adhesion and device wafer manufacture, the wafer may be released from the substrate by solubilizing the adhesive in the presence of a polar solvent, with or without applied heating, to disrupt the adhesion and allow wafer removal and subsequent cleaning and processing.

In one or more embodiments, polyimide compositions may be prepared with an equimolar (50:50) ratio of diamine (such as diamine bis[(aminophenoxy)phenyl]sulfone, BAPS, as shown by the general formula (1) where $R^3$ is H, $CH_3$, or halogen) and dianhydride (such as 4,4'-bisphenol-A dianhydride, BPADA, as shown by formula (2)) to produce polyimides and polyimide precursors having acceptable solubility and thermal characteristics for use as an adhesive.

(1)

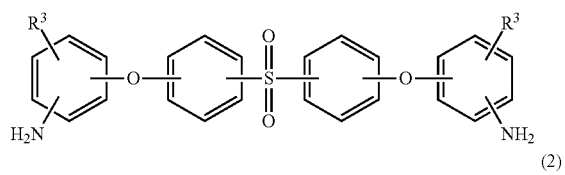

(2)

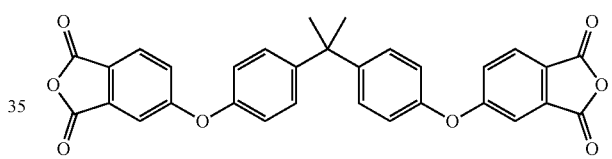

While the polyimide forming reaction reacts according to the ratio of 1:1 diamine:dianhydride, it is also envisioned that the ratio may be outside of this ratio depending on the intended application. For example, where the polyimide is to be reacted with a functionalized surface, such as a glass surface aminated with a silane coupling agent, the ratio may favor the anhydride monomer (1:1.1 to 1:2 diamine:dianhydride, for example), in order to increase the likelihood that the terminal groups of the polyimide are dianhydrides available to attach to the aminated surface.

In one or more embodiments, polyimide compositions and polyimide precursor compositions may be prepared from a reaction of one or more diamines and one or more dianhydrides, where the one or more diamines have a molar percentage (mol %) of the moles of diamine that is 60 to 99 mol % of BAPS and 1 to 40 mol % of one or more additional diamine comonomers, and where the one or more dianhydrides have a mol % of the moles of dianhydride that is 60 to 99 mol % of BPADA and 1 to 40 mol % of one or more additional dianhydride comonomers. For example, a polyimide composition may be prepared from a reaction of diamines and dianhydrides, where the moles of the diamine component are 80 mol % of BAPS and 20 mol % of another diamine comonomer, and where the moles of the dianhydride component are 70 mol % BPADA and 30 mol % of another dianhydride comonomers.

Polyimide compositions in accordance with the present disclosure may be prepared from the reaction of a number of monomers falling in the general classes of diamines and dianhydrides. Diamines and dianhydrides react to form a polyamic acid that undergoes further condensation to exclude water, generating the final polyimide. Polyimide compositions in accordance with the present disclosure may be generated using a number of known solid-, melt- and solution-phase polymerization techniques. Further, polyimide compositions and polyimide precursors in accordance with the present disclosure may be formulated as random copolymers or block copolymers with various comonomers in some embodiments.

Polyimide compositions in accordance with the present disclosure may include or produce a polyimide having the number average molecular weight in a range having a lower limit selected from any of 5, 10, 11, and 20 kDa, to an upper limit selected from any of 40, 70, 90, and 100 kDa, where any lower limit may be paired with any upper limit. However, it is envisioned that the polymer chain lengths, and the effective molecular weight, may be tuned through additives such as chain limiters to modify the chain length and molecular weight according to the requirements of the particular application in which the polyimide is used.

Diamines

Diamines in accordance with the present disclosure may include aromatic diamine compounds having a carbon number of 6 to 27 such as bis[4-(3-aminophenoxy)phenyl]sulfone (BAPS-m), bis[4-(4-aminophenoxy)phenyl]sulfone (BAPS-p), 1,4-diaminobenzene (PPD), 1,3-diaminobenzene (MPD), 2,4-diaminotoluene (2,4-TDA), 4,4'-diaminodiphenylmethane (MDA), 4,4'-diaminodiphenylether (ODA), 3,4'-diaminodiphenylether (DPE), 3,3'-dimethyl-4,4'-diaminobiphenyl (TB), 2,2'-dimethyl-4,4'-diaminobiphenyl (m-TB), 2,2'-bis(trifluoromethyl)-4,4'-diaminobiphenyl (TFMB), 3,7-diamino-dimethyldibenzothiophen-5,5-dioxide (TSN), 4,4'-diaminobenzophenone, 3,3'-diaminobenzophenone, 4,4'-bis(4-aminophenyl) sulfide (ASD), 4,4'-diaminodiphenyl sulfone (ASN), 4,4'-diaminobenzanilide (DABA), 1,n-bis(4-aminophenoxy)alkane (n=3, 4 or 5, DAnMG), 1,3-bis(4-aminophenoxy)-2,2-dimethylpropane (DANPG), 1,2-bis[2-(4-aminophenoxy)ethoxy]ethane (DA3EG), 1,5-bis(4-aminophenoxy) pentane (DASMG), 1,3-bis(4-aminophenoxy) propane (DA3MG), 9,9-bis(4-aminophenyl)fluorene (FDA), 5(6)-amino-1-(4-aminomethyl)-1,3,3-trimethylindan, 1,4-bis(4-aminophenoxy)benzene (TPE-Q), 1,3-bis(4-aminophenoxy)benzene (TPE-R), 1,3-bis(3-aminophenoxy)benzene (APB), 4,4'-bis(4-aminophenoxy) biphenyl (BAPB), 4,4'-bis(3-aminophenoxy)biphenyl, 2,2-bis(4-aminophenoxyphenyl)propane (BAPP), 2,2-bis[4-(4-aminophenoxy)phenyl]hexafluoropropane (HFBAPP), 3,3'-dicarboxy-4,4'-diaminodiphenylmethane (MBAA), 4,6-dihydroxy-1,3-phenylenediamine (known as 4,6-diaminoresorcin), 3,3'-dihydroxy-4,4'-diaminobiphenyl (HAB) and 3,3',4,4'-tetraminobiphenyl (TAB); aliphatic or alicyclic diamine compounds having a carbon number of 6 to 24 such as 1,6-hexamethylenediamine (HMD), 1,8-octamethylenediamine (OMDA), 1,9-nonamethylene diamine, 1,12-dodecamethylene diamine (DMDA), 1-amino-3-aminomethyl-3,5,5-trimethylcyclohexane, 4,4'-dicyclohexylmethanediamine and cyclohexanediamine; and silicone based diamine compounds such as 1,3-bis(3-aminopropyl)-1,1,3,3-tetramethyldisiloxane and polydimethyl siloxane (PDMS). Polyimide formulations in accordance with the present disclosure may include one or more diamine monomers such as those described above. In specific embodiments, adhesive compositions may include at least one comonomer that is not polydimethyl siloxane or a derivative thereof.

In one or more embodiments, polyimide compositions may contain one or more diamines selected from bis[4-(3-aminophenoxy)phenyl]sulfone (BAPS-m), bis[4-(4-aminophenoxy)phenyl]sulfone (BAPS-p), 1,2-bis[2-(4-aminophenoxy)ethoxy]ethane (DA3EG), 1,5-bis(4-aminophenoxy) pentane (DA5MG), polydimethyl siloxane (PDMS), and 1,6-hexamethylenediamine (HMD).

In one or more embodiments, a polyimide may be prepared from a reaction of one or more diamines and one or more dianhydrides, where the one or more diamines contain 60 to 100 mol % diamine bis[4-(3-aminophenoxy)phenyl]sulfone (BAPS-m) and 0 to 40 mol % of one or more additional diamine comonomers.

In one or more embodiments, polyimide may contain, in a selected ratio, diamine comonomers that incorporate "soft" alkyl backbones that may modify the modulus of the cured polyimide, which may minimize residual stress and warpage on coated substrates. For example, a polyimide or polyimide precursor may incorporate one or more flexible comonomers that include: aromatic diamines (3) or (4), wherein each $R^3$ is independently selected from H, $CH_3$, or halogen, and n is an integer in the range of 1 to 7, and alkyl diamines such as hexamethylene diamine (5). In some embodiments, aromatic diamines, such as those according to the formulae (3) and (4), may also exhibit reduced salt formation when compared with more basic alkyl diamines, such as hexamethylene diamine (5).

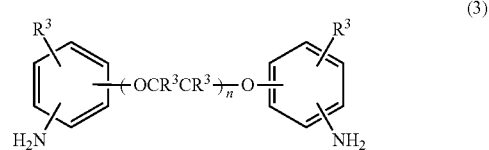

(3)

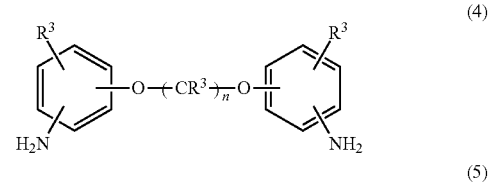

(4)

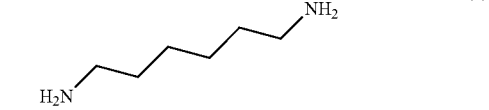

(5)

In one or more embodiments, polyimide compositions and polyimide precursors may incorporate one or more additional diamine comonomers at a molar ratio of the diamine component relative to the primary diamine monomer in the range having a lower limit selected from any of 0, 0.1, and 0.5, to an upper limit selected from any of 0.3, 0.4, and 0.5, where any lower limit may be paired with any upper limit.

The one or more additional diamine comonomers may be selected from diamines having a linear alkyl carbon chain of at least 2 carbon atoms long in some embodiments, and from at least 5 carbon atoms long in other embodiments.

Dianhydrides

Dianhydrides in accordance with the present disclosure include tetracarboxylic anhydrides and other bifunctional anhydrides that are capable of reaction with a suitable diamine to form a polyamic acid and/or polyimide.

In one or more embodiments, dianhydrides may include aromatic tetracarboxylic acid dianhydrides having a carbon number of 6 to 18 such as pyromellitic dianhydride (PMDA), 4,4'-bisphenol A dianhydride (BPADA), biphenyl-3,4,3',4'-tetracarboxylic dianhydride (BPDA), 2,2' bis(4-hydroxyphenyl) propanedibenzoate-3,3',4,4'-tetracarboxylic acid dianhydride (ESDA), 1,2 bis(trimellitate)ethane dianhydride (TMEG). Other dianhydrides may include oxydiphthalic dianhydride (ODPA), benzophenone-3,4,3',4'-tetracarboxylic dianhydride (BTDA), diphenylsulfone-3,4,3',4-tetracarboxylic dianhydride (DSDA), 4,4'-(2,2-hexafluoroisopropylidene)bis(phthalic anhydride) (6FDA) and m(p)-terphenyl-3,4,3',4'-tetracarboxylic dianhydride; and alicyclic tetracarboxylic dianhydrides having a carbon number of 4 to 6 such as cyclobutane-1,2,3,4-tetracarboxylic dianhydride and 1-carboxymethyl-2,3,5-cyclopentanetricarboxylic-2,6:3,5-dianhydride. Polyimide formulations in accordance with the present disclosure may include one or more dianhydride monomers such as those described above.

In one or more embodiments, a polyimide may be prepared from the reaction of one or more diamines and one or more dianhydrides, where the one or more dianhydrides include 60 to 100 mol % dianhydride 4,4'-bisphenol A dianhydride (BPADA) and 0 to 40 mol % of one or more additional dianhydride comonomers.

In one or more embodiments, polyimide may contain, in a selected ratio, dianhydride comonomers that incorporate "soft" alkyl backbones that may modify the modulus of the cured polyimide, which may minimize residual stress and warpage on coated substrates. For example, a polyimide or polyimide precursor may incorporate one or more flexible comonomers that include: dianhydride (3), wherein $R^4$ is $CH_2$, and n is an integer in the range of 1 to 5.

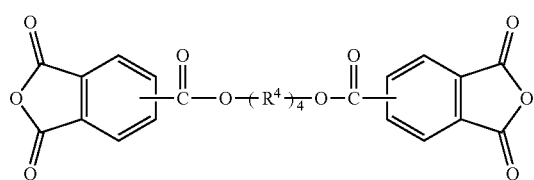

(6)

In one or more embodiments, polyimide compositions and polyimide precursors may incorporate one or more additional dianhydride comonomers at a molar ratio of the dianhydride component relative to the primary dianhydride monomer in the range having a lower limit selected from any of 0, 0.1, and 0.5, to an upper limit selected from any of 0.3, 0.4, and 0.5, where any lower limit may be paired with any upper limit.

Solvents

Polyimide compositions in accordance with the present disclosure may be soluble or partly soluble in a number of polar solvents. Polar solvents may be used to prepare solubilized polymer solutions that may be used to apply the polyimide composition as a temporary bonding adhesive and/or remove the adhesive when desired. In some embodiments, polyimide compositions in accordance with the present disclosure may be formulated in a suitable polar solvent at a polymer or solid content at a percent by weight (wt %) as high as 40 wt %. During device wafer processing, the solvent can be applied to a polyimide adhesive to disrupt adhesions (such as between a substrate and a device wafer) or to remove adhesive residues remaining on the substrate and/or device wafer.

Polar solvents in accordance with the present disclosure include gamma-butyrolactone (GBL), dimethyl acetamide (DMAc), dimethyl formamide (DMF), and dioxolane. Other polar solvents may include dimethylsulfoxide and N-methylpyrrolidone, N-hexyl-2-pyrrolidone, 1,3-dimethyl-2-imidazolidone, phenol solvents such as phenol, o-, m-, or p-cresol, xylenol, halogenated phenols, and catechol, or hexamethylphospholamide, and the like. Solvents may include ketones such as diisopropyl ketone, methylethyl ketone, acetylacetone, acetophenone, and cyclohexanone; and ethers, such as diisopropyl ether, ethylbutyl ether, and dichloroisopropyl ether, and esters, such as ethyl acetate, butyl acetate, cellosolve acetate, carbitol acetate, methyl acetoacetate, methyl propionate, methyl butyrate, and methyl phthalate Polyimide compositions in accordance with the present disclosure may be solubilized in a polar solvent, and applied to various substrates to generate coatings that may vary from thin films (1-15 microns) to thicker coatings (>25 microns). Polyimide compositions may be formulated as a varnish containing a concentration of polyimide or polyamic acid precursor in a polar solvent (or mixture of solvents) that may range from a percent by weight (wt %) of 0.5 wt % to 40 wt % in some embodiments, and from 1 wt % to 30 wt % in other embodiments. For example, polyimide compositions may be formulated as a varnish in polar solvents gamma-butyrolactone or DMF, at a polymer concentration of >30 wt % to generate thick coatings (by spray or spin coating) having a thickness of >25 microns.

In one or more embodiments, polyimide compositions and polyimide precursors may be formulated with a percent by weight of solvent (wt %) that ranges from a lower limit selected from any of 40, 50, and 60 wt %, to an upper limit selected from any of 75, 80, 90, and 95 wt %, where any lower limit may be paired with any upper limit.

Following application of a polyimide composition or polyimide precursor to a substrate, thermal processing or vacuum may be used to cure the polyimide and remove the trace solvent and other volatiles. The residual volatile component in a cured polyimide may be 5 wt % or lower in some embodiments, and 3 wt % or lower in other embodiments.

EXAMPLES

Preparation of Polyimides

In the following examples, polyimide compositions were generated from the reaction of diamines and dianhydrides at a ratio of 1:1. Copolymers in the following examples were prepared using an additional diamine or dianhydride comonomer at a 20% ratio relative to the corresponding monomer (i.e., diamine comonomers were added at a ratio relative to the first diamine monomer and dianhydride comonomers were added at a ratio relative to the first dianhydride).

Polyimide compositions in accordance with the present disclosure were formulated as polyamic acid varnishes in a 2 L glass reactor (>500 g scale) with stirring, or in a 250 mL glass bottle (<100 g scale) with stirring or agitation by shaker, and under an atmosphere of argon or nitrogen. Polyimide powder was obtained either by chemical or thermal curing.

Glass transition (Tg) measurements were carried out on a Q2000 DSC model from TA Instruments. All samples were subjected to two heating cycles. A fast heating cycle was measured at 20° C./min from 50° C. to 350° C., followed by cooling to 50° C. at 20° C./min. Midpoint Tg data was obtained from the second heating cycle run at 10° C./min.

Temperatures at 5% weight loss ($Td_{5\%}$) measurements were carried out on a Q50 TGA model from TA Instruments. The temperature was ramped at a rate of 10° C./min from 50° C. to 900° C. Samples were held for 60 min at a desired temperature when monitoring isothermal weight loss.

Molecular weight determinations for all samples were carried out on a Shimadzu UFLC instrument fitted with Phenomenex Phenogel gel permeation chromatography (GPC) columns having a UV and RI detection capability for separation. Molecular weight measurements were done in NMP solvent at 40° C. and referenced to polystyrene standards. Spin-coatings were performed with a VTC-100 vacuum spin coater. Viscosity of varnish at room temp was measured using Brookefield DV1M model.

Example 1: BAPS-m+[BPADA+PMDA], PI-1

A two liter reactor vessel charged with GBL (583.1 g) was treated with BAPS-m (121.11 g, 0.280 mol) with slow stirring. A pale yellow solution is obtained upon complete solvation of the diamine within a few minutes. BPADA (116.65 g, 0.224 mol) is added to the solution and a 70° C. water bath is set around the reactor. A clear yellow solution is achieved after 90 min of stirring in the water bath. An additional 20 min of stirring is carried out to equilibrate the mixture, and followed up by cooling the entire reactor for 2 h with an ice bath. Once the entire mixture has chilled, PMDA (12.24 g, 0.056 mol) was added to the solution. The mixture was noted to build viscosity with the disappearance of PMDA within a few minutes. The reaction was stirred an additional 90 minutes with the ice bath. The varnish viscosity at the end of the reaction was measured to be 189 Poise at 30% solid content.

To make the polyimide, 200 g varnish was diluted to 300 g with GBL followed by addition of three molar equivalence of pyridine (41.12 g, 0.402 mol) and acetic anhydride (31.88, 0.402 mol) and let stir for 1 h. This mixture was slowly added to rapidly stirred water to obtain off-white strands of polyimide. The precipitate was filtered and let sit overnight in clean water. Alternatively, isopropanol can also be used for precipitation. The next day, the product was filtered and washed with isopropanol. It was then dried in a convection oven at 150° C. for 3 days. Tg=200° C.; $Td_{5\%}$=484° C.; Mw=35.3 kDa.

Example 2: [BAPS-m+DA5MG]+BPADA, PI-2

A 250 mL glass bottle charged with DMF (23.5 g) was treated with BAPS-m (3.76 g, 0.009 mol). A golden yellow solution is obtained within a few minutes via agitation in an shaker at room temperature. Dianhydride BPADA (5.69 g, 0.011 mol) is added to the solution and the shaker temperature was raised to 60° C. Agitation for 1 h resulted in a clear solution. An aromatic diamine bearing an alkyl backbone, DA5MG (0.65 g, 0.002 mol) was subsequently added and shaken at 60° C. for 6 h to get an amber brown varnish.

To make the polyimide, 23.1 g varnish was treated with excess of pyridine (5.1 g, 0.065 mol) and acetic anhydride (6.6 g, 0.065 mol) and let agitate for 4.5 hours. This mixture was slowly added to rapidly stirred isopropyl alcohol to obtain off-white strands of polyimide. The precipitate was filtered and further purified by Soxhlet extraction using IPA for 3 hours. The powdery precipitate was dried in convection oven at 150° C. for 3 days. Tg=182° C.; $Td_{5\%}$=474° C.; Mw=29.2 kDa.

Example 3: BAPS-m+BPADA, PI-3

The polyimide was prepared similar to Examples 1 and 2. Homopolymer PI-3 is made with BAPS-m and BPADA at a 1:1 ratio. In DMF solvent, BPADA dissolves quickly and does not necessarily need heating at 60° C., unlike samples prepared in GBL solvent. The polymer exhibits a Tg=190° C.; $Td_{5\%}$=465° C.; and Mw=23.5 kDa.

Example 4: [BAPS-m+DA3EG]+BPADA, P1-4

The polyimide was prepared similarly to Example 2 except an aromatic diamine bearing an alkyl backbone, DA3EG, was added as a comonomer. The varnish had a viscosity of 6 Poise at 20% solid content. The polymer exhibits a Tg=172° C.; $Td_{5\%}$=447° C.; and Mw=20.6 kDa.

Example 5: BAPS-m+[BPADA+TMEG], P1-5

The polyimide was prepared similarly to Example 2 except that a dianhydride bearing an alkyl backbone, TMEG, was added as a comonomer. The varnish had a viscosity of 187 Poise at 30% solid content. The polymer exhibits a Tg=190° C.; $Td_{5\%}$=446° C.; and MW=59.0 kDa.

Example 6: [BAPS-p+DA5MG]+[BPADA+PMDA], P1-6

A 250 mL glass bottle was charged with diamines BAPS-p (4.01 g, 0.009 mol) and DA5MG (0.663 g, 0.002 mol), and treated with DMF (30.0 g) to give a colorless solution within few minutes of stirring. Dianhydride BPADA (4.82 g, 0.009 mol) is added and the reaction stirred in a 60° C. oil bath for 1 h. This solution is then chilled to 4° C. followed by addition of PMDA (0.51 g, 0.002 mol) to obtain a pale brown varnish after 4 h of stirring.

To make the polyimide, polyamic acid powder was precipitated by addition of varnish to rapidly stirred ethanol. The powder was imidized thermally in an air convection oven at 200° C. for 2.5 h to yield a yellow product. Tg=222° C.; $Td_{5\%}$=491° C.; Mw=52.9 kDa.

Example 7: [BAPS-m+DA5MG]+[BPADA+PMDA], P1-7

The polyimide was prepared similarly to Example 6 except that the meta-isomer, BAPS-m, was used in place of para-isomer, BAPS-p. The polymer exhibits a Tg=193° C.; $Td_{5\%}$=483° C.; and MW=60.4 kDa.

Example 8: [BAPS-m+HMD]+BPADA, P1-8

The polyimide was prepared similarly to Example 2 except that an alkyl diamine comonomer, HMD, was added. Salt precipitation was observed in the varnish due to high basicity of the alkyl diamine and had to be filtered. The resulting Mw was much lower at 13.0 kDa. This phenomenon is not observed with the less basic aromatic diamine with alkyl backbones in examples 2, 4, 6, and 7. The polymer exhibits a Tg=160° C. and $Td_{5\%}$=445° C.

Example 9: [BAPS-m+PDMS]+BPADA, P1-9

The polyimide was prepared similarly to Example 2 except that an alkyl diamine comonomer, PDMS (Mn avg=2,500 Da), was added. Salt precipitation was observed in the varnish due to high basicity of alkyl diamine and had to be filtered. The resulting Mw was much lower at 12.0 kDa. This phenomenon is not observed with the less basic aromatic diamine with alkyl backbones in examples 2, 4, 6, and 7. The polymer exhibits a Tg=176° C. and Td$_{5\%}$=479° C.

Thermal Stability Over Extended Periods

Polyimide compositions in accordance with the present disclosure may exhibit extended stability (up to an hour) under high temperatures (350° C.) with minimal weight loss. In the following example, isothermal analysis was conducted for a number of polyimides synthesized in accordance with the present disclosure. The results are tabulated in Table 1.

TABLE 1

Percent weight loss over 60 minute isotherm at 350° C.

| Polyimide | Formulation | % weight loss (under N$_2$/Air*) |
| --- | --- | --- |
| PI-1 | BAPS-m + [BPADA + PMDA] 1:[0.8:0.2] | 0.67/0.74* |
| PI-2 | [BAPS-m + DA5MG] + BPADA [0.8:0.2]:1 | 0.66* |
| PI-3 | BAPS-m + BPADA 1:1 | 0.81/0.80* |
| PI-4 | [BAPS-m + DA3EG] + BPADA [0.8:0.2]:1 | 0.43 |
| PI-5 | BAPS-m + [BPADA + TMEG] 1:[0.8:0.2] | 0.70/1.75* |
| PI-6 | [BAPS-p + DA5MG] + [BPADA + PMDA] [0.8:0.2]:[0.8:0.2] | 0.49 |
| PI-7 | [BAPS-m + DA5MG] + [BPADA + PMDA] [0.8:0.2]:[0.8:0.2] | 0.37 |
| PI-8 | [BAPS-m + HMD] + BPADA [0.8:0.2]:1 | 1.72* |

The thermally robust nature of the polyimides is apparent from the thermal gravimetric analysis (TGA) data acquired with the observance of less than 2% weight loss under air and less than 1% weight loss under a nitrogen atmosphere for the compositions.

Coating and Adhesion on Substrates

Precursors of polyimide composition such as polyamic acid may be formulated as a varnish and coated on a substrate such as glass. The polyamic acid film may be cured to produce a polyimide film using thermal processing in an oven or other suitable method, which results in the production of a cured polyimide layer having good adhesion to the glass surface. The formation of the polyimide by dehydration and cyclization to the imide ring occurs at elevated temperature, whereby the acid may have an oxidizing effect on the surface of the substrate and a thin oxidized layer at the interface can help promote the adhesion with a combination of various intermolecular forces such as dipole-dipole interactions.

Example 10

Eagle® glass substrates (500 μm thick) were spin coated with a polyimide precursor varnish from any of the above mentioned examples to obtain a near uniform coating (edge beading was observed which is not uncommon in this technique), which was then cured in a convection oven at 290° C. for 60 min. Alternatively, samples may be cured in 6 min when placed directly on a 300° C. hot plate. Thickness ranging from 15 μm to 150 μm was noted after curing the coats made from 20% to 40% solid content of PI-3 varnish. At 30% solid content, polyimide film thickness after curing the varnish is 45-55 μm as seen with PI-1, PI-3 and PI-5.

Example 11

Polyimide adhesives coated at a thickness of 50 μm on Eagle® glass substrates were placed in a DMF or DMAc solvent bath. At room temperature, the adhesives are removed between 5-15 minutes. At 60° C. bath temperature, the adhesive is removed within a few minutes. Any residue, if present, can be rinsed away after removal from solvent bath.

Example 12

An Eagle® glass substrate with a cured polyimide adhesive coating of 50 μm is placed on top of another clean glass substrate with the adhesive layer in between. Hot pressing between 250° C. to 300° C. for 15 min at pressures of 2 psi (0.014 MPa) and greater results in good adhesion. Both substrates can also be coated before pressing.

Example 13—Residual Stress

Incorporation of soft segments with comonomers bearing alkyl groups in the polyimide formulation may help minimize the residual stress exerted by the adhesive on a thin substrate, which accordingly minimizes warpage, when necessary. Residual stress measurements of polyimide adhesives on a 500 μm or a 700 μm thick Eagle® glass substrate at a coating thickness of 10 μm were measured using a thin film stress measurement system, Toho FLX 2320-S under nitrogen (Table 2).

TABLE 2

Residual stress of polyimides

| Entry | Formulations with diamine + dianhydride | Comonomer X (mol %) | Residual Stress (MPa) |
| --- | --- | --- | --- |
| 1 (PI-3) | BAPS-m + BPADA 1:1 | — | 43 |
| 2 (PI-5) | BAPS-m + [BPADA + X] 1:[0.8:0.2] | TMEG (20) | 33 |
| 3 (PI-2) | [BAPS-m + X] + BPADA 0.8:0.2:1 | DA5MG (20) | 32 |
| 4 | TFMB + 6FDA 1:1 | — | 50 |
| 5 | [TFMB + X] + 6FDA [0.8:0.2]:1 | DA3EG (20) | 48 |
| 6 | [TFMB + X] + 6FDA [0.8:0.2]:1 | DA3MG (20) | 43 |
| 7 | [TFMB + X] + 6FDA [0.8:0.2]:1 | DA5MG (20) | 42 |
| 8 | TFMB + BPDA 1:1 | — | 45 |
| 9 | [TFMB + X] + BPDA [0.95:0.05]:1 | DA3EG (5) | 39 |
| 10 | [TFMB + X] + BPDA [0.8:0.2]:1 | DA3MG (20) | 38 |
| 11 | [TFMB + X] + BPDA [0.95:0.05]:1 | DA5MG (5) | 37 |
| 12 | [TFMB + X] + BPDA [0.8:0.2]:1 | DA5MG (20) | 32 |

It is noted that the use of dianhydride TMEG and diamine DASMG can effectively reduce the residual stress of the homopolymer PI-3 (Entry 1 as compared to 2 and 3). Further, the diamines DA3EG, DA3MG and DASMG can serve this purpose for any given base homopolymer formulation as shown in entries 4 to 7 and 8 to 12. Residual stress is lowered up to 30%.

Taken as a whole, all properties observed in examples described above with formulations PI-1 through PI-7 and others, provide excellent results for polyimide compositions in accordance with the present disclosure.

Polyimide compositions in accordance with the present disclosure may be employed as high temperature resistant temporary bonding adhesives usable on next-generation thin silicon wafers and in chip manufacturing process. All polymers exhibit good extended thermal stability with <1% weight loss on exposures to temperatures as high as 350° C. for periods up to an hour. This shows that the integrity of adhesive will be maintained on bonded wafers undergoing similar processing conditions.

Adhesiveness of the polyimide compositions of the present disclosure may be initiated by thermally curing the polyimide after applying a coating of a polyimide composition precursor, such as a polyamic acid varnish, on the substrate of interest such as glass or silicon wafers. The thickness of the layer can be controlled by the percent solid content of the varnish and/or by the method of application. Hot-pressing a coated wafer above the Tg of the polyimide to another wafer may be used to obtain wafer to wafer bonding. Polyimide compositions and polyimide precursors may also incorporate monomers with alkyl chains to add flexibility to the polyimide, which may lower residual stress and warpage when applied to a substrate. In addition, the adhesive can be removed when necessary to obtain a clean wafer by exposure to polar solvents after debonding.

Although only a few examples have been described in detail above, those skilled in the art will readily appreciate that many modifications are possible in the examples without materially departing from this subject disclosure. Accordingly, all such modifications are intended to be included within the scope of this disclosure as defined in the following claims.

What is claimed is:

1. A composition, comprising:
   a polyimide precursor composition prepared from a reaction of a diamine component and a dianhydride component, wherein the reaction comprises:
   a diamine component comprising one or more diamines having the formula:

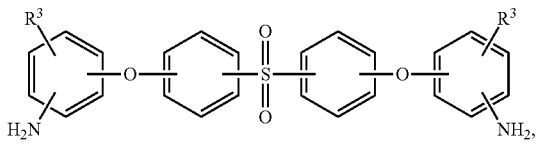

wherein R3 is selected from a group consisting of hydrogen, methyl, and halogen;
   a dianhydride component comprising one or more dianhydrides, wherein the one or more dianhydrides comprise 4,4'-bisphenol A dianhydride (BPADA);
   one or more additional diamine comonomers selected from a group consisting of 2-bis[2-(4-aminophenoxy)ethoxy]ethane (DA3EG) and 1,5-bis(4-aminophenoxy) pentane (DA5MG), wherein the one or more additional diamine comonomers are necessarily present in the diamine component; and
   optionally an additional dianhydride comonomer that is pyromellitic dianhydride (PMDA), wherein the additional dianhydride comonomer is optionally present at 1 to 40 mol % of the dianhydride component;

wherein a molar ratio of the one or more additional diamine comonomers relative to the one or more diamines in the diamine component is in a range of 0.1 to 0.40, and
   wherein the polyimide precursor composition comprises less than 10 wt % of thermosetting compounds.

2. The composition of claim 1, wherein the polyimide precursor composition comprises a polar solvent selected from the group consisting of gamma-butyrolactone (GBL), dimethyl acetamide (DMAc), dimethyl formamide (DMF), dioxolane, dimethylsulfoxide and N-methylpyrrolidone, N-hexyl-2-pyrrolidone, 1,3-dimethyl-2-imidazolidone, phenol, o-cresol, m-cresol, or p-cresol, xylenol, halogenated phenols, and catechol, or hexamethylphospholamide.

3. The composition of claim 1, wherein the polyimide precursor composition comprises 50 to 95 wt % of a polar solvent.

4. The composition of claim 1, wherein a molar ratio of the additional dianhydride comonomer relative to the one or more dianhydrides in the dianhydride component is in a range of 0.1 to 0.40.

5. A method comprising:
   coating a substrate with a polyimide precursor composition prepared from a reaction of a diamine component and a dianhydride component, wherein the reaction comprises:
   a diamine component comprising one or more diamines having the formula:

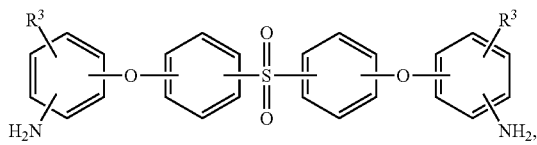

wherein $R^3$ is selected from a group consisting of hydrogen, methyl, and halogen;
   a dianhydride component comprising one or more dianhydrides, wherein the one or more dianhydrides comprise 4,4'-bisphenol A dianhydride (BPADA);
   one or more additional diamine comonomers selected from a group consisting of 2-bis[2-(4-aminophenoxy)ethoxy]ethane (DA3EG) and 1,5-bis(4-aminophenoxy) pentane (DA5MG), wherein the one or more additional diamine comonomers are necessarily present in the diamine component; and
   optionally an additional dianhydride comonomer that is pyromellitic dianhydride (PMDA), wherein the additional dianhydride comonomer is optionally present at 1 to 40 mol % of the dianhydride component; and
   curing the polyimide precursor composition to generate a polyimide adhesive on the substrate,
   wherein a molar ratio of the one or more additional diamine comonomers relative to the one or more diamines in the diamine component is in a range of 0.1 to 0.40, and
   wherein the polyimide precursor composition comprises less than 10 wt % of thermosetting compounds.

6. The method of claim 5, further comprising affixing a device wafer to the polyimide adhesive.

7. The method of claim 6, further comprising removing the polyimide adhesive from the device wafer using a polar solvent.

8. The method of claim 5, wherein the polyimide precursor composition comprises 50 to 95 wt % of a polar solvent.

9. The method of claim 5, wherein a molar ratio of the additional dianhydride comonomer relative to the one or more dianhydrides in the dianhydride component is in a range of 0.1 to 0.40.

10. The method of claim 5, wherein the weight loss of the polyimide adhesive at 350° C. after 60 minutes is less than 2 wt %.

11. The method of claim 5, wherein the polyimide adhesive has a Tg in the range of 150 to 300° C.

12. A coated substrate, comprising:
a substrate coated with a polyimide adhesive, wherein the polyimide adhesive is prepared from a reaction of a diamine component and a dianhydride component to obtain a polyimide precursor composition, wherein the reaction comprises:
  a diamine component comprising diamine bis[(aminophenoxy)phenyl]sulfone (BAPS);
  a dianhydride component comprising 4,4'-bisphenol A dianhydride (BPADA);
    one or more additional diamine comonomers selected from a group consisting of 2-bis[2-(4-aminophenoxy)ethoxy]ethane (DA3EG) and 1,5-bis(4-aminophenoxy) pentane (DA5MG), wherein the one or more additional diamine comonomers are necessarily comprised in of the diamine component; and
    optionally an additional dianhydride comonomer that is pyromellitic dianhydride (PMDA), wherein the additional dianhydride comonomer is optionally comprised at 1 to 40 mol % of the dianhydride component,
  wherein a molar ratio of the one or more additional diamine comonomers relative to the one or more diamines in the diamine component is in a range of 0.1 to 0.40, and
  wherein the polyimide precursor composition comprises less than 10 wt % of thermosetting compounds.

13. The coated substrate of claim 12, wherein the polyimide film thickness is in the range of 0.5 to 200 μm.

14. The coated substrate of claim 12, wherein the weight loss of the film at 350° C. after 60 minutes is less than 2 wt %.

15. The coated substrate of claim 12, wherein the polyimide adhesive has a Tg in the range of 150 to 300° C.

16. The coated substrate of claim 12, wherein the substrate is selected from a group consisting of glass, silicon, and silicon carbide.

17. The coated substrate of claim 12, wherein the number average molecular weight of the polyimide is 11 to 100 kDa.

18. The coated substrate of claim 12, further comprising a device wafer adhered to the coated substrate.

* * * * *